(12) United States Patent
Lee et al.

(10) Patent No.: US 7,650,255 B2
(45) Date of Patent: Jan. 19, 2010

(54) AUTOMATIC SELECTIVE RETEST FOR MULTI-SITE TESTERS

(75) Inventors: Chi Tsung Lee, Taipei (TW); Sheng Pin Chen, Taipei (TW); Ming Chuan You, Taipei (TW); Shou Ping Hsu, Taipei (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/114,551

(22) Filed: May 2, 2008

(65) Prior Publication Data

US 2009/0276175 A1    Nov. 5, 2009

(51) Int. Cl.
*G01R 31/14* (2006.01)
(52) U.S. Cl. ............ 702/118; 324/765; 702/120; 714/742
(58) Field of Classification Search ........... 702/81, 702/108, 118, 119, 120, 831, 183; 714/29, 714/718; 324/158.1
See application file for complete search history.

(56) References Cited

U.S. PATENT DOCUMENTS 7,184,917 B2 * 2/2007 Pramanick et al. .......... 702/120

2006/0195747 A1 * 8/2006 Pramanick et al. .......... 714/742
2007/0063724 A1 * 3/2007 Roberts et al. ............. 324/765
2007/0132477 A1 * 6/2007 Balog et al. ................ 324/765

* cited by examiner

*Primary Examiner*—John H Le
(74) *Attorney, Agent, or Firm*—Yingshen Tung; Wade J. Brady, III; Frederick J. Telecky, Jr.

(57) ABSTRACT

A method of multi-site testing a batch of semiconductor units using a multi-site automated tester (100). The tester (300) includes a handler (320) coupled to a contactor (330) including a first plurality of contact sites. The method includes the step of loading the first plurality of units into the first plurality of contact sites (201). The first plurality of units are simultaneously tested (202) using a test program to determine bin information for each of the first plurality of units, wherein the bin information defines each of the first plurality units as being a passed unit or a reject unit. The passed units are offloaded from respective contact sites of the first plurality of contact sites to create vacant contact sites (203), while keeping the reject unit(s) at respective contact sites of the first plurality of contact sites. Untested units from the batch are then loaded to fill the vacant contact sites (204). Simultaneously, the reject units retested and untested units are tested using the test program (205).

19 Claims, 4 Drawing Sheets

AUTOMATIC SELECTIVE RETEST FOR MULTI-SITE TESTERS

FIELD OF INVENTION

This invention relates to semiconductor chip testing and more particularly multi-site testers and testing.

BACKGROUND

Being able to test more than one device at a time on a given tester is a simple and effective means of lowering test time and improving throughput, provided the hardware and software allow it. There are generally two different methods for testing multiple devices simultaneously on a tester.

The first method is referred to as dual-site testing. In this method, the hardware is split evenly into an X quadrant and a Y quadrant, and each quadrant is controlled by either the primary or a secondary controller. Dual site testing is basically just two test programs running simultaneously on the same TESTER, each having its own controller and hardware. Since there is only one high speed clock on the TESTER, special attention must generally be paid when using clocks to allow the two test programs to synchronize.

The other method of simultaneous testing is referred to as multi-site testing. In this method, the test hardware is split up by the test software. This means that more than two devices can be tested if the hardware allows. The software generally allows up to 32 devices to be tested in the multi-site mode, although, for most devices, hardware limitations limit the number of devices to generally 8 devices. Multi-site testing is generally preferred over dual-site for a number of reasons. After a multi-site test program is written, it can easily be modified to test a different number of devices if needed, while dual-site testing is limited to only two devices. Also, because dual-site testing utilizes two separate controllers, it does not allow for as accurate control and timing of the test program, compared to a test program controlled by a single controller.

Currently, the automatic testing (AT) procedures for handling a given lot (or batch) of semiconductor units are yield-dependent. Many varying factors contribute to low-yield, and hence, a re-screen of failed units is usually performed. Retesting of reject units is known for re-binning a percentage of reject units into good units. A conventional "manual" retest method (generally referred to as the "Manual rescreen") comprises retesting all rejected units after all units in the lot have completed the test. Operators generally retrieve units binned as rejects, and manually reload these units into the handler for retesting. The manual rescreen method generally results in wasted time waiting for:

a) trailing units in the lot to be unloaded/sorted;
b) the handler to determine a clean empty state;
c) the operator to close the current segment (requires counting and handling of units);
d) the operator to initialize a new segment for the re-screen (requires counting and handling of units in addition to other paperwork/actions);
e) the operator to manually load the units into the input of the handler;
f) the handler to initialize its modules coming from a stop state, and
g) the handler to load the units into the contact site(s) to be tested.

Although generally effective for re-binning a percentage of reject units into good units, potentially productive test time is wasted by the required operator handling time, as well as time for the handler to index the units for retest.

Another known retest method for multi-site testers comprises the "auto-reprobe" method which results from the capability to re-insert the failing units. Auto-reprobe is performed by issuing a retract and contact of the contact site plunger mechanism. Primarily designed to improve miscontact and reduce overkill, auto-reprobe is generally an improvement as compared to the manual rescreen method. However, auto-reprobe is known to work well for only for devices with long test times and lower parallelism on the load boards. The inherent problem with the auto-reprobe method is that it reduces multi-site efficiency (MSE) while trying to improve miscontact. Specifically, good units are replunged with the bad devices. When devices run comparatively short test times and high parallelism, the adverse affect on MSE becomes more severe. As a result, for devices with short test times (e.g. <5 secs) and higher multi-site solutions (e.g. $\geq 8$), auto-reprobe may result in no test efficiency improvement over the manual rescreen method.

Variants of known retest methods include auto-reprobe only during a rescreen segment. This variant does not generally eliminate the losses described above. This variant merely reduces the possibility of a 2nd manual re-screen.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The actual time lost in any of the rescreen methods described above was estimated by the present Inventors using an overall equipment efficiency (OEE) model. From preliminary data, losses were estimated to be around 4% for manual re-screen and can be more than 4% for the auto-reprobe method or related variants for short test times (e.g. <5 seconds, particularly for test times <2 seconds) and high parallelism on the load boards. Embodiments of the present invention referred to herein as "automatic selective retest" can eliminate a majority of the losses and thus can provide a 2% to a 4% OEE gain which translates into significantly reduced cost/unit test cost.

Embodiments of the present invention include a multi-site automated tester and related automatic selective retest method. Instead of unloading then loading the reject units from a batch of semiconductor units for rescreen as in a manual rescreen, the units are instead generally handled by binning and sorting only the passing (good) units to create vacant contact sites, and indexing untested units into the vacant contact sites thus replacing only the sorted good units. The reject units remain at their respective contact sites and are re-plunged and re-tested along with the untested units in the next test cycle, in contrast with conventional auto-reprobe which keeps both good and reject units at their respective contact sites and reduces tester efficiency by retesting both good and reject units.

In an embodiment of the invention, a method of multi-site testing a batch of semiconductor units uses a multi-site automated tester, the tester comprising a handler coupled to a contactor comprising a first plurality of contact sites. The method comprises the step of loading the first plurality of units into the first plurality of contact sites. The first plurality of units are simultaneously tested using a test program to determine bin information for each of the first plurality of units, wherein the bin information defines each of the first plurality units as being a passed unit or a reject unit. The passed units are offloaded from respective contact sites of the first plurality of contact sites to create vacant contact sites while keeping the reject units at respective contact sites of the first plurality of contact sites. Untested units from the batch are then loaded to fill the vacant contact sites. Simultaneously, the reject units retested and untested units tested using the test program.

A multi-site automated test system comprises a handler coupled to a contactor comprising a first plurality of contact sites and a microprocessor comprising controller coupled to the handler and contactor, the microprocessor running stored code. The code provided implements selective retesting according to an embodiment of the invention, by including appropriate handler to tester communications to implement automatic selective retest.

Selective retest testing according to embodiments of the invention can recover a significant portion (e.g. at least ½) of the 4% OEE loss characteristic of conventional retesting sequencings. Embodiments according to the invention thus generally reduce total test times for the batch, increase throughput, and can also improve yields by allowing the tester to adjust to setup problems.

DETAILED DESCRIPTION

Figure 1:
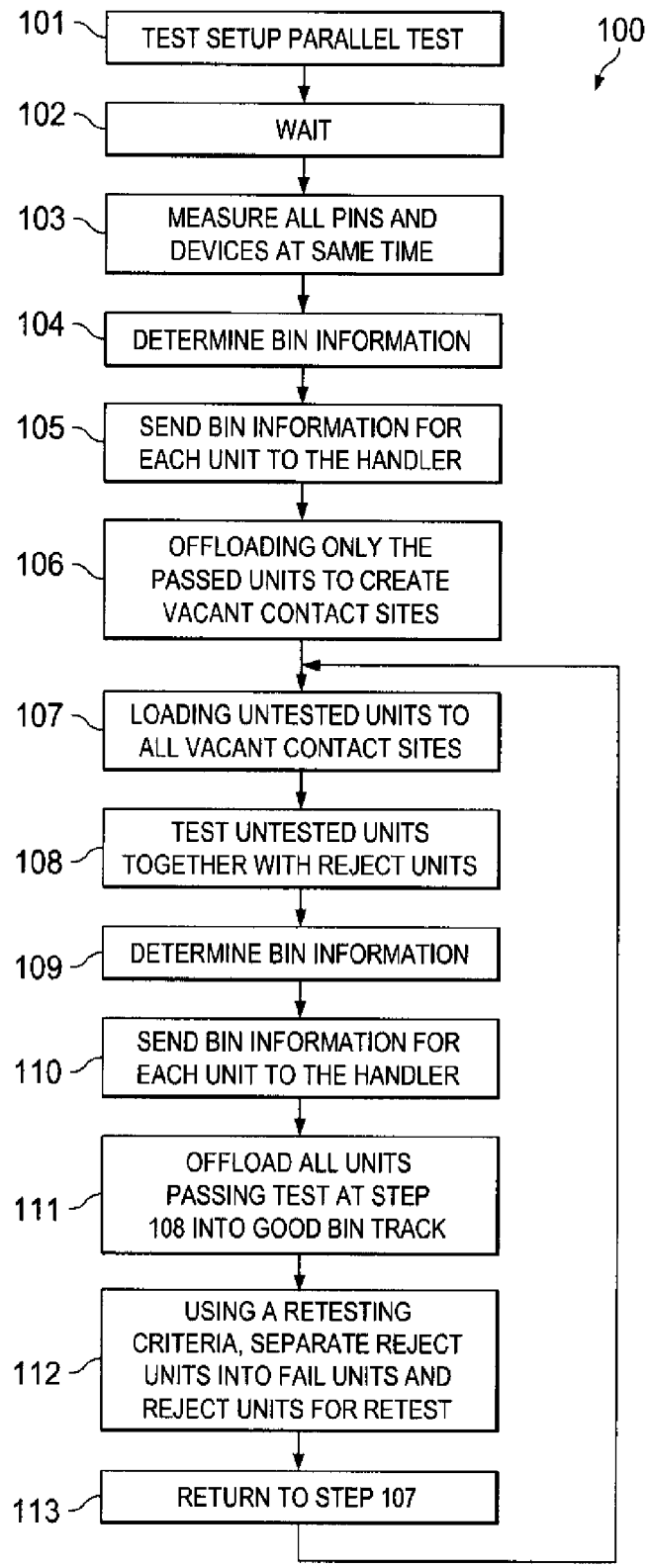
FIG. 1 is a flow chart of an exemplary automatic selective retesting procedure for a multi-site tester according to one embodiment of the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 is a flow chart of an exemplary automatic selective retesting procedure for a multi-site tester 100 according to one embodiment of the present invention. The first step 101 is the test setup for parallel test. Multiple units from a batch to be tested using a device test program are loaded into a first plurality of contact sites (e.g. 4 or 8 sites), the required connections are made, and the required test conditions are applied to the units. The second step 102 is the wait time required to allow conditions to settle and stabilize.

The next step is the measuring step 103 which comprises simultaneously testing the first plurality of units using a device test program. In step 104 based on the test results the tester determines bin information for each of the first plurality of units selected from one or more bins representing passed units and one or more reject bins representing reject units. Step 105 comprises the tester sending a message to the handler comprising bin information associated with each unit. Step 106 comprises offloading only the passed units into a good bin track to create vacant contact sites while keeping the reject units at their respective contact sites. In step 107 untested (fresh) units from the batch are automatically loaded by the handler from the batch to fill the vacant contact sites. In step 108, simultaneously the reject units are retested and untested units from the batch are first tested using the test program. In step 109 bin information is determined by the tester. In step 110 the bin information is sent by the tester to the handler. In step 111, the units in the passing bin whether previously untested units or retested units at step 108 are offloaded into the good bin track. In step 112, using a retesting criteria, the reject units are separated into either declared failed units which are offloaded into the reject track, or reject units to be retested. In step 113, provided there are additional untested units, the method returns to step 107, where the vacant contact sites comprising those that contact sites that held offloaded units from step 111 and those contact sites that held offloaded reject units from step 112 are loaded with untested units.

One retesting criteria can comprise a predetermined number of retests in which a given unit is determined to be in the reject bin. For example, a reject unit that is determined upon one or two retests to again be a reject unit can be declared a failed unit. Another retesting criteria can be based on the number of failing pins associated with the particular unit. Yet another retesting criteria can be based on parametric data associated with the particular unit.

Figure 2:
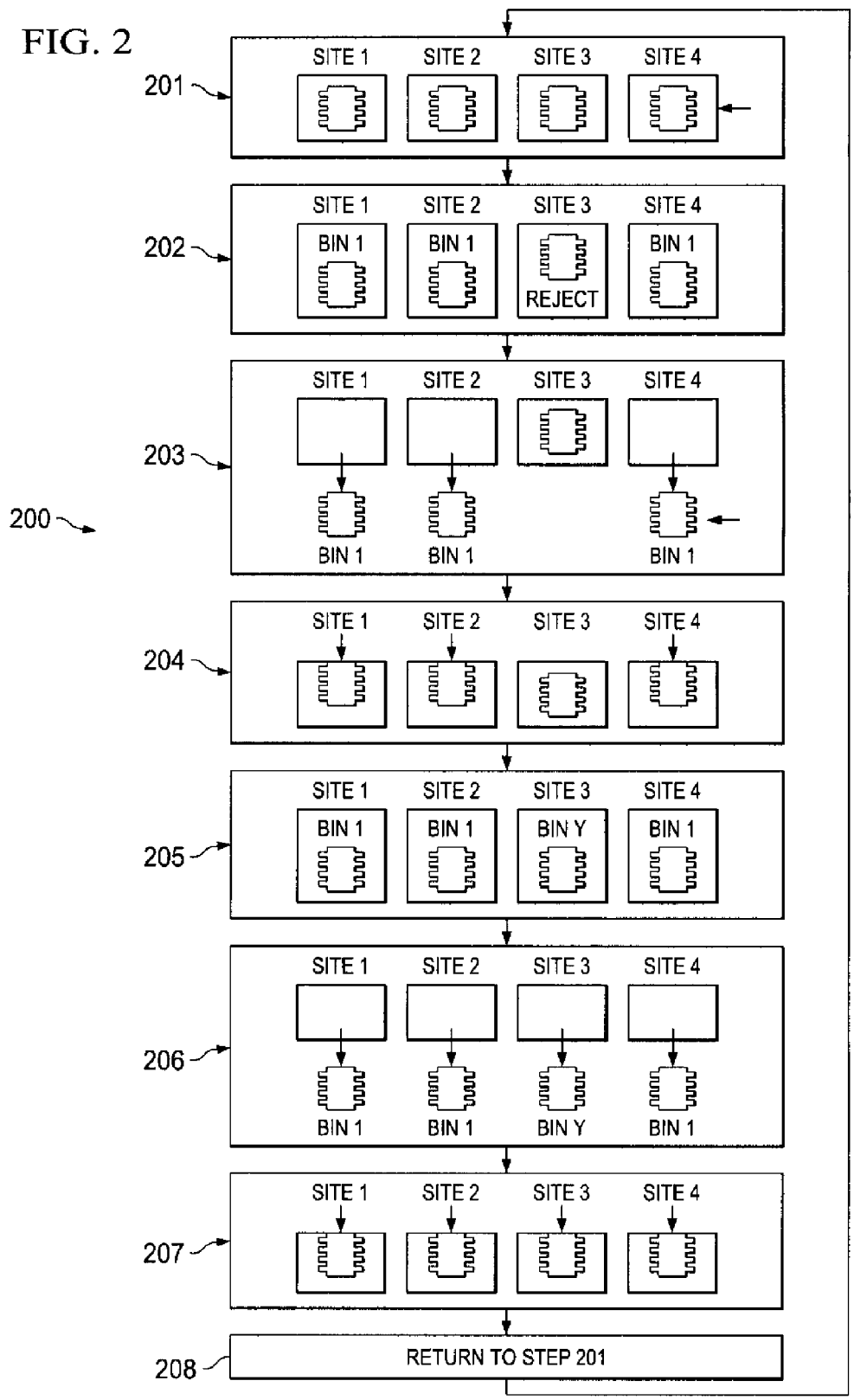
FIG. 2 illustrates an exemplary automatic selective retesting sequence for a quad tester according to an embodiment of the invention.

FIG. 2 is an illustration of an exemplary testing sequence 200 according to an embodiment of the invention. Step 201 illustrates four units under test at contact sites 1, 2, 3 and 4 after being loaded by the handler. Step 202 illustrates sites 1, 2 and 4 being determined to be bin 1 (good units), with site 3 having a reject unit. The handler receives this information from the tester. Step 203 illustrates the bin 1 units from sites 1, 2 and 4 being offloaded from their respective contact sites to create vacant contact sites while the reject unit in site 3 remains in its contact site.

In step 204 untested units from the batch are loaded into sites 1, 2 and 4 and the test performed. Step 205 shows the fresh (untested) units testing bin 1, with the retest unit testing bin Y. Step 206 comprises the handler offloading sites 1, 2, 3 and 4 and sorting by the test results, irrespective of whether the unit in site 3 being retested passes or fails the retest. In 207, the handler loads untested units from the batch into contact sites 1, 2, 3 and 4. In step 208, the method returns to step 201. Although FIG. 2 shows the initially rejected unit having only a single retest before being offloaded to the reject track, as described above the test program can allow two or more retests should the retest fail before unloading such a unit, such as based on the number of failing pins.

Embodiments of the present invention are generally compatible with existing commercially available automatic tester and handler hardware. Generally, only a software change to a program referred to as USP which controls handler and tester communications is need to implement the invention.

Figure 3:
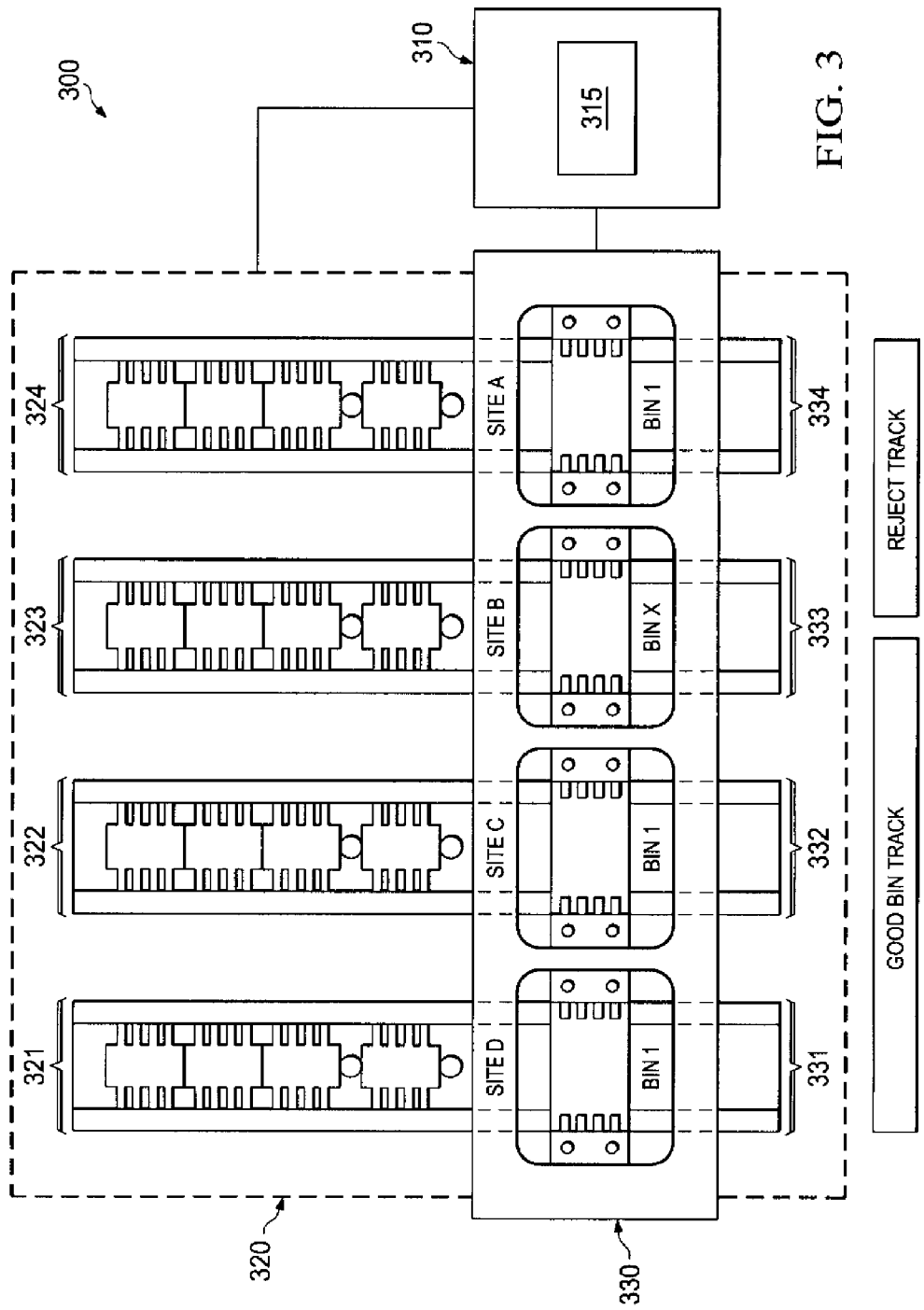
FIG. 3 illustrates a multi-site test system having a gravity handler configured to implement automatic selective retesting according to embodiments of the invention.

FIG. 3 illustrates a multi-site (quad) automatic test system (tester) 300 having a gravity handler 320 configured to implement automatic selective retesting according to embodiments of the invention. System 300 comprises contactor 330. A computer 310 includes a microprocessor comprising controller 315 that is operative to run software that implements automatic selective retesting according to embodiments of the invention. Computer generates a bin message that is sent to handler 320. Handler 320 includes independently selectable inlet gates 321-324 and outlet gates 331-334 for controlling the indexing of units, so that selected sites can be loaded or offloaded based on a bin message provided to the handler 320 by the system 300.

The handler 320 sorts the units as directed by the bin message received. In an event of jam or unexpected event (e.g. power failure), the units can be allowed to be "flushed" to a "reset" bin. The handler can be responsible for reporting these flushed units in the gone-to-retest counters and buffers. All units in the reset bin can be tested.

Figure 4:
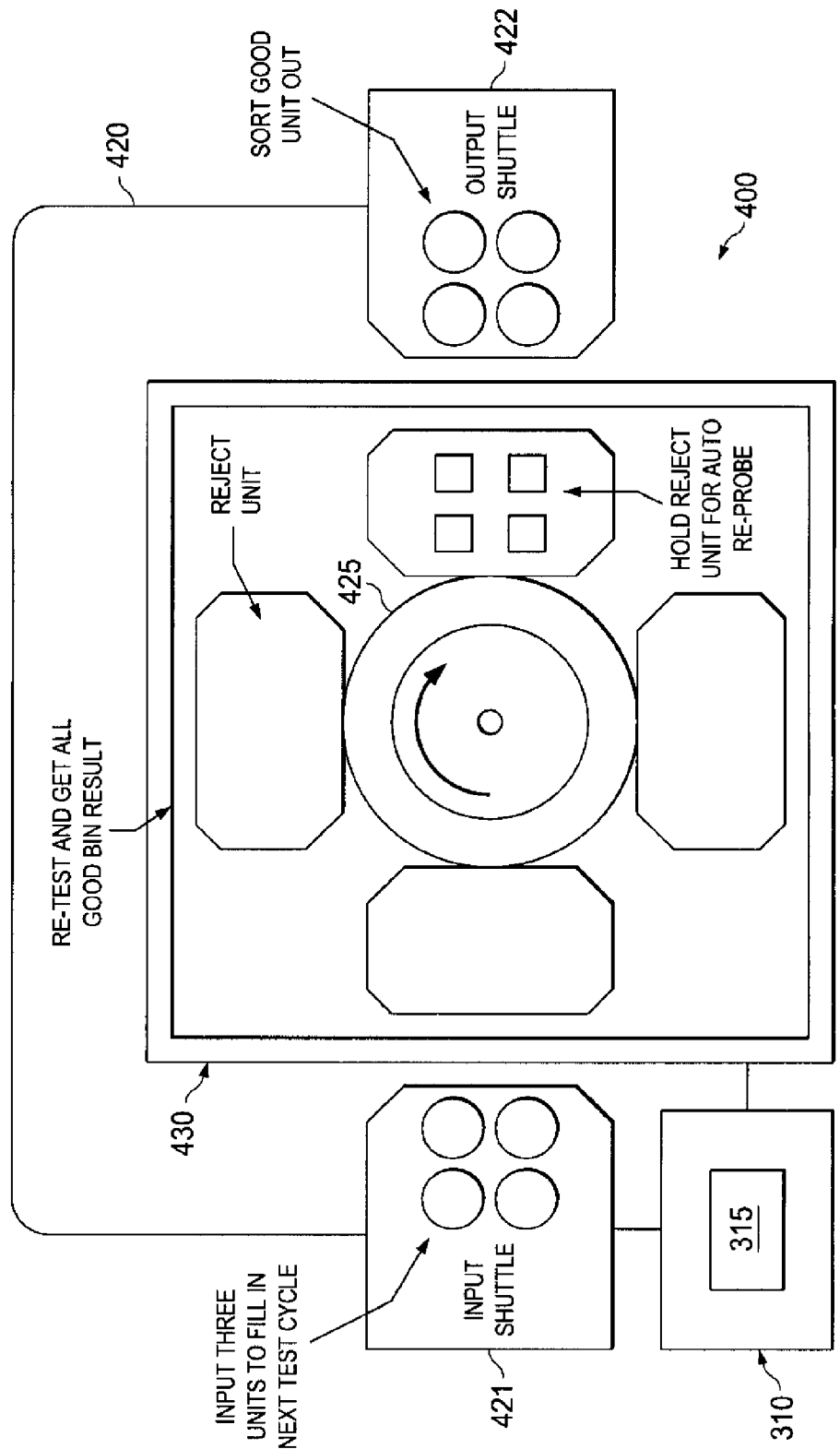
FIG. 4 illustrates a multi-site test system comprising a contactor having a rotating member, a pick and place handler, and a controller and associated computer running software configured to control handler and tester communications to implement automatic selective retesting according to embodiments of the invention.

FIG. 4 illustrates a multi-site (quad) automatic test system (tester) 400 having a pick and place handler 420 having software for handler to tester communications to implement automatic selective retesting according to embodiments of the invention. For example, the handler 420 can be a HS2040 tray type handler sold by Yokogawa Electric Corporation, 2-9-32 Nakacho, Musashino-shi, Tokyo. The HS2040 tray type handler interfaces with a rotating contact module. The handler comprises an unloader arm operable to selectively pick units from the output shuttle and send good units to the good units tray and units deemed rejects (such as after failing initial test and retest) to a bad units tray. Reject units for retesting are not binned by the unloader arm and returned for retest by rotating member 425 along with untested units from the untested units tray sent to the contactor by the loader arm of the handler. A computer 310 includes a microprocessor comprising controller 315 that is operative to run software that controls handler and tester communications for implementing automatic selective retesting according to embodiments of the invention. For a 3 second test time, a 2% OEE improvement is estimated (thus eliminating about ½ of the 4% loss for conventional rescreen processes).

A test sequence is depicted in FIG. 4 where 4 units after having been tested includes 3 good units and 1 reject unit. Handler 420 loads 3 untested units using input portion 421 which are combined with the reject unit which are tested together by contactor 430. All four units tested as good units (3 being first pass units and 1 being a previously rejected unit) are binned as good units and the output portion 422 of handler 420 sorts out all 4 units.

The handler can track each unit by its unit#, which can be the 2nd argument in the bin message provided. As described above, the tester can retest a given reject unit as many times as desired. Additional commands can include "AE n reprobe" which can be used to determine the specific sites determined to require a retest. It is noted that 'n' in the command above can be a list of sites for retest, such as 3 in the case that only site 3 is to be retested.

Regarding sorting and indexing action, the handler can wait for a retest message as described above followed by a bin message from the tester. The bin message can be a partial bin message. As known in the art, a partial bin message results if any test result(s) is (are) missing for one or more units from bin message. In the case of a partial bin message, the handler will generally stop and display an error message for a communication error. Under partial bin mode according to an embodiment of the invention, the handler can accept the missing signal for the unit#. The missing signal can trigger the unit# to be retested at next cycle.

The good/passing units (from the bin message) will generally be binned and sorted (offloaded into the good bin track into one or more good bins). Untested units from the batch will generally be indexed to replace the sorted passing units. Reject units as described above are re-plunged and re-tested along with the untested units in the next cycle. The handler is generally responsible for ensuring that the reject units along with the untested units are re-plunged. The handler can be configured to not index any units until it receives a message for every unit that the handler is presented for test.

In one embodiment, there are two different possible messages for each unit. A BIN message tells the handler what HandlerBin to sort the unit. A RETEST message tells the handler that a particular unit is to be held for retest. The sequence of these two messages sent to the handler by the tester can be in either order.

For example, in a 4-site setup ("sn" stands for serial number):

Tester determination example 1: BIN units in sites 1, 2, and 4; RETEST the unit in site 3:
  AE reprobesite 3
  BA1,<sn>,1;2,<sn>, 1;3, <sn>, 1

Tester determination example 2: BIN units are in sites 1 and 3; RETEST units in sites 2 and 4:
  AE reprobesite 2,4
  BA1, <sn>, 1;3,<sn>, 1

This alternative sequence can also generally be used:
  AE reprobesite 2
  AE reprobesite 4
  BA1,<sn>,1;3,<sn>, 1

After the handler receives information from the tester for each unit in the contact sites, it can proceed to sort the units for which it received a BIN message for and index new units from the batch into the vacant sites created to replace the sorted units. As described above, the BIN message generally also includes units determined to be reject units.

Special considerations can be applied to certain tester configurations. For handlers which comprises two or more stacked rows of contact sites, such as an octal site handler having upper and lower contact sites, if the "lower" unit BINS, but the "upper" unit is determined to need retest, the upper unit that requires retest blocks the handlers ability to populate the lower site. In this case, the good unit is sorted creating a vacant site and the unit requiring retest is transferred to the lower site and an untested unit is loaded into the upper contact site for the next test insertion.

In the case the "upper" unit is BINned, but the "lower" unit required retest, the lower unit that requires retest blocks the handler's ability to keep the good unit on the upper site. In this case, the good units will stay in upper site and only lower units reach re-test. After that, the upper unit and lower unit can sort together into the track.

The handler can hold the upper and lower unit, but remember the BIN result for the upper unit and not request test of that unit, since the tester already knows its proper destination. The successfully tested and BINned unit will (after one or more test insertions) go to it's proper destination (after the blocking lower unit finally gets a BIN result and gets sorted and thus out of the way).

By keeping reject units in their contact site and retesting the reject units in their contact site until a BIN determination is made, the OEE can be significantly increased, such as eliminating ½ or more of the 4% loss for conventional rescreen processes. Embodiments of the invention also save operating time for handling, including close of the batch, open of the batch, program load, and handler index time.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of multi-site testing a batch of semiconductor units using a multi-site automated tester, said tester comprising a handler coupled to a contactor comprising a first plurality of contact sites, comprising the steps of:
    (a) loading a first plurality of said units into said first plurality of contact sites;
    (b) simultaneously testing said first plurality of units using a test program to determine bin information for each of said first plurality of units, said bin information defining each of said first plurality units being a passed unit or a reject unit;
    (c) offloading said passed units from respective contact sites of said first plurality of contact sites to create vacant contact sites while keeping said reject units at respective contact sites of said first plurality of contact sites;
    (d) loading untested units from said batch to fill said vacant contact sites, and
    (e) simultaneously retesting said reject units and testing said untested units using said test program.

2. The method of claim 1, further comprising the step of applying a retesting criteria to determine which of said reject units are offloaded as failed units along with said passed units in said offloading step, and which of said reject units participate in said retesting.

3. The method of claim 2, wherein said retesting criteria comprises a predetermined number of repetitions of said retesting.

4. The method of claim 3, wherein said predetermined number is 1.

5. The method of claim 2, wherein said retesting criteria comprises a predetermined number of failing pins.

6. The method of claim 1, wherein for each of said plurality of units based on results from said simultaneous testing said handler receives either a bin message including said bin information or a retest message instructing said retesting.

7. The method of claim 1, wherein said bin message further comprises an identifier for identifying said plurality of units receiving said bin message.

8. The method of claim 7, wherein said identifier comprises a number.

9. The method of claim 1, wherein said handler comprises a pick and place handler.

10. The method of claim 1, wherein said handler comprises a gravity handler.

11. A multi-site automated test system, comprising:
    a handler coupled to a contactor comprising a first plurality of contact sites and a microprocessor comprising controller coupled to said handler and contactor; said microprocessor running stored code, said code comprising:
    (a) code for loading a first plurality of semiconductor units from a batch of semiconductor units into said first plurality of contact sites;
    (b) code for simultaneously testing said first plurality of units using a test program to determine bin information for each of said first plurality of units, said bin information defining each of said first plurality units being a passed unit or a reject unit;
    (c) code for offloading said passed units from respective contact sites of said first plurality of contact sites to create vacant contact sites while keeping said reject units at respective contact sites of said first plurality of contact sites;
    (d) code for loading untested units from said batch to fill said vacant contact sites, and
    (e) code for simultaneously retesting said reject units and testing said untested units using said test program.

12. The test system of claim 11, wherein said handler includes a plurality of independently selectable inlet gates and a plurality of independently selectable outlet gates for controlling indexing of said plurality of units based on said bin information provided to said handler.

13. The test system of claim 11, wherein said code includes a retesting criteria to determine which of said reject units are offloaded as failed units along with said passed units in said offloading step, and which of said reject units participate in said retesting.

14. The test system of claim 13, wherein said retesting criteria comprises a predetermined number of repetitions of said retesting.

15. The test system of claim 11, wherein for each of said plurality of units based on results from said simultaneous testing said handler receives either a bin message including said bin information or a retest message instructing said retesting.

16. The test system of claim 15, wherein said bin message further comprises an identifier for identifying said plurality of units receiving said bin message.

17. The test system of claim 16, wherein said identifier comprises a number.

18. The test system of claim 11, wherein said handler comprises a pick and place handler.

19. The test system of claim 11, wherein said handler comprises a gravity handler.

* * * * *